US010509060B2

(12) United States Patent
Peisert et al.

(10) Patent No.: US 10,509,060 B2
(45) Date of Patent: Dec. 17, 2019

(54) METHODS, SYSTEMS, AND DEVICES FOR IDENTIFYING COMPUTATIONAL OPERATIONS BASED ON POWER MEASUREMENTS

(71) Applicants: Sean Peisert, San Rafael, CA (US); Charles McParland, Berkeley, CA (US)

(72) Inventors: Sean Peisert, San Rafael, CA (US); Charles McParland, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 328 days.

(21) Appl. No.: 15/661,941

(22) Filed: Jul. 27, 2017

(65) Prior Publication Data
US 2018/0059153 A1 Mar. 1, 2018

Related U.S. Application Data (60) Provisional application No. 62/368,957, filed on Jul. 29, 2016.

(51) Int. Cl.
| | | |
|---|---|---|
| G06F 11/30 | (2006.01) | |
| G01R 21/133 | (2006.01) | |
| G06F 11/34 | (2006.01) | |
| G01R 17/02 | (2006.01) | |
| G01R 25/00 | (2006.01) | |

(52) U.S. Cl.
CPC ............ *G01R 21/133* (2013.01); *G06F 11/34* (2013.01); *G01R 17/02* (2013.01); *G01R 25/00* (2013.01)

(58) Field of Classification Search
CPC .................................................... G01R 21/133
See application file for complete search history.

(56) References Cited

U.S. PATENT DOCUMENTS

| | | | |
|---|---|---|---|
| 9,134,353 B2 * | 9/2015 | Jia .......................... | G06Q 40/04 |
| 2015/0096026 A1 * | 4/2015 | Kolacinski .............. | G06F 21/55 |
| | | | 726/23 |

\* cited by examiner

*Primary Examiner* — Phuong Huynh
(74) *Attorney, Agent, or Firm* — Kwan & Olynick LLP (57) ABSTRACT

Disclosed herein are methods, systems, and devices for identifying computational operations based on power measurements. Disclosed herein are systems that may include a phase measurement unit configured to generate a first measurement based on a power signal, the first measurement characterizing a phase angle of the power signal. The systems may also include a power measurement unit configured to generate a second measurement based on the power signal, the second measurement characterizing an amplitude of one or more aspects of the power signal. The systems may further include a processing unit configured to identify a computational operation implemented by a target processing device, the identifying of the computational operation being based on a comparison of the first measurement and the second measurement with reference measurements.

20 Claims, 10 Drawing Sheets

METHODS, SYSTEMS, AND DEVICES FOR IDENTIFYING COMPUTATIONAL OPERATIONS BASED ON POWER MEASUREMENTS

CROSS-REFERENCE TO RELATED APPLICATIONS

This application claims the benefit under 35 U.S.C. § 119(e) of U.S. Provisional Patent Application No. 62/368,957, filed on Jul. 29, 2016, which is incorporated herein by reference in its entirety for all purposes.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to power measurements, and more particularly to identifying computational operations based on such power measurements.

BACKGROUND

Computer machines and data processing systems may be made of several different hardware components that may include computer processing units (CPUs), graphical processing units (GPUs), input/output (I/O) devices such as hard disks, various other forms of memory which may be volatile or non-volatile, cooling systems, and network cards. Such hardware components may be used for specific purposes and at specific times during computational operations executed on the computer machines and data processing systems. Moreover, such hardware components may utilize a particular amount of power when used. Furthermore, such computer machines and data processing systems may be specifically configured to implement resource intensive computational operations. Accordingly, such computer machines and data processing systems may include and utilize many CPUs, GPUs, and I/O devices collectively to implement a particular type of computational operation.

SUMMARY

Disclosed herein are methods, systems, and devices for identifying computational operations based on power measurements. Disclosed herein are systems that may include a phase measurement unit configured to generate a first measurement based on a power signal, the first measurement characterizing a phase angle of the power signal. The systems may also include a power measurement unit configured to generate a second measurement based on the power signal, the second measurement characterizing an amplitude of one or more aspects of the power signal. The systems may further include a processing unit configured to identify a computational operation implemented by a target processing device, the identifying of the computational operation being based on a comparison of the first measurement and the second measurement with reference measurements.

In various embodiments, the phase measurement unit is configured to generate the first measurement based on a difference between phases of a voltage signal and a current signal included in the power signal. In some embodiments, the power measurement unit is configured to generate the second measurement based on a first amplitude of the voltage signal and a second amplitude of the current signal. According to various embodiments, the processing unit is configured to identify one or more computational events associated with the target processing device based, at least in part, on the first measurement and the second measurement. The processing unit may be further configured to identify one or more computational operations based, at least in part, on the identified one or more computational events.

In some embodiments, the processing unit is configured to identify one or more automatic operations based on the identified computational operation. In various embodiments, the processing unit is further configured to generate a message in response to identifying, the message causing implementation of the one or more automatic operations. In particular embodiments, the power signal is received from one of a group consisting of: a computer processing unit, a graphical processing unit, a network card, and an input/output device. In various embodiments, the phase measurement unit and the power measurement unit are coupled in series with a source associated with the power signal. According to some embodiments, the phase measurement unit and the power measurement unit are coupled in parallel with a source associated with the power signal.

Also disclosed herein are systems that may include a coupler and a phase measurement unit configured to generate a first measurement based on a power signal, the first measurement characterizing a phase angle of the power signal. The systems may also include a power measurement unit configured to generate a second measurement based on the power signal, the second measurement characterizing an amplitude of one or more aspects of the power signal. The systems may further include a processing unit configured to identify a computational operation implemented by a target processing device, the identifying of the computational operation being based on a comparison of the first measurement and the second measurement with reference measurements. The systems may also include an interface configured to communicatively couple the coupler with the phase measurement unit and the power measurement unit.

In various embodiments, the phase measurement unit is configured to generate the first measurement based on a difference between phases of a voltage signal and a current signal included in the power signal, and the power measurement unit is configured to generate the second measurement based on a first amplitude of the voltage signal and a second amplitude of the current signal. In particular embodiments, the processing unit is configured to identify one or more computational events associated with the target processing device based, at least in part, on the first measurement and the second measurement, and the processing unit is further configured to identify one or more computational operations based, at least in part, on the identified one or more computational events. In some embodiments, the processing unit is configured to identify one or more automatic operations based on the identified computational operation. In various embodiments, the coupler is coupled in series with a source associated with the power signal. In some embodiments, the coupler is coupled in parallel with a source associated with the power signal.

Further disclosed herein are methods that may include generating a plurality of signal measurements based on a power signal associated with at least one signal source, generating a plurality of reference measurements based, at least in part, on the plurality of signal measurements, and identifying at least one computational operation based, at least in part, on a comparison between the plurality of reference measurements and the plurality of signal measurements, the computational operation being implemented by a target processing device. In various embodiments, the generating of the plurality of signal measurements further includes generating, using a phase measurement unit, a first measurement based on a difference between phases of a voltage signal and a current signal included in the power signal, and generating, using a power measurement unit, a second measurement based on a first amplitude of the voltage signal and a second amplitude of the current signal.

In some embodiments, the methods may also include identifying one or more automatic operations based on the identified computational operation, and generating a message in response to identifying, the message causing implementation of the one or more automatic operations. In various embodiments, the power signal is received from one of a group consisting of: a computer processing unit, a graphical processing unit, a network card, and an input/output device.

Details of one or more embodiments of the subject matter described in this specification are set forth in the accompanying drawings and the description below. Other features, aspects, and advantages will become apparent from the description, the drawings, and the claims.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

In various embodiments, computer machines and data processing systems may be specifically configured to implement resource intensive computational operations that utilize many CPUs, GPUs, and I/O devices collectively for particular types of computational events and operations. In various embodiments, computational events may be a specific utilization, or activation and deactivation, of a particular type of hardware component, such as a CPU, GPU, I/O device, or network card. In some embodiments, computational operations may be broader computational motifs often formed from a combination of computational events, and specific to a particular computational use. For example, computational operations may be a dense linear algebra computation, a sparse linear algebra computation, and a matrix multiplication computation. Computational operations may also include broader patterns such as atmospheric simulation, monitoring of climate data, super nova simulation, tree search and graph problems, password cracking (which may be CPU intensive), video transcoding (which may be I/O intensive), and prime factoring of numbers (which may use integer arithmetic). In some embodiments, the implementation of these computational events and operations utilizes power from a power source and may cause fluctuations in a power signal as hardware components are activated and deactivated.

Various devices, systems, and methods disclosed herein are configured to obtain measurements of such changes and fluctuations in the power signal, and are further configured to identify computational events and operations underlying the changes and fluctuations. In this way, by utilizing measurements of the power signal, devices, systems, and methods disclosed herein may be able to determine and infer what computational operations are being performed by a target processing device or system. As will be discussed in greater detail below, various measurements, such as those collected by a power meter and phase meter, may be obtained from a power signal associated with a power source that supplies power to the target device or system. The measurements may be compared with previously generated reference measurements to identify one or more computational events and operations.

In various embodiments, additional automatic actions or operations may be implemented responsive to identifying computational events and operations. For example, unauthorized computational operations may be identified and automatically terminated. Moreover, computational operations exceeding power specifications may be identified and automatically terminated. In some embodiments, security access levels associated with users of the target device or system may be automatically adjusted or revoked. In this way, embodiments disclosed herein provide additional benefits to areas such as power management and security policy management.

As will also be discussed in greater detail below, embodiments as disclosed herein may be implemented within the target device or system, or remote from the target device or system. For example, an organization or company may focus on internal monitoring of its own computational systems, and may implement devices and systems as disclosed herein within its own data processing system. In another example, such access to the target device or system might not be possible, and devices and systems as disclosed herein may be implemented in a remote location that is separate from the target device or system, and possibly attached to a different portion of a power grid used to supply power to the target device or system. Accordingly, devices, systems, and methods disclosed herein provide the ability to determine or infer computational activity of a target device or system in a variety of configurations and distances with respect to the target device or system, and thus provide improvements to various technical fields, such as signal processing and power management. Moreover, devices, systems, and methods disclosed herein may improve the functioning of the processing hardware that is utilized by enabling the implementation and automation of additional features, such as efficient power management and hardware resource utilization, as will be discussed in greater detail below.

Figure 1:
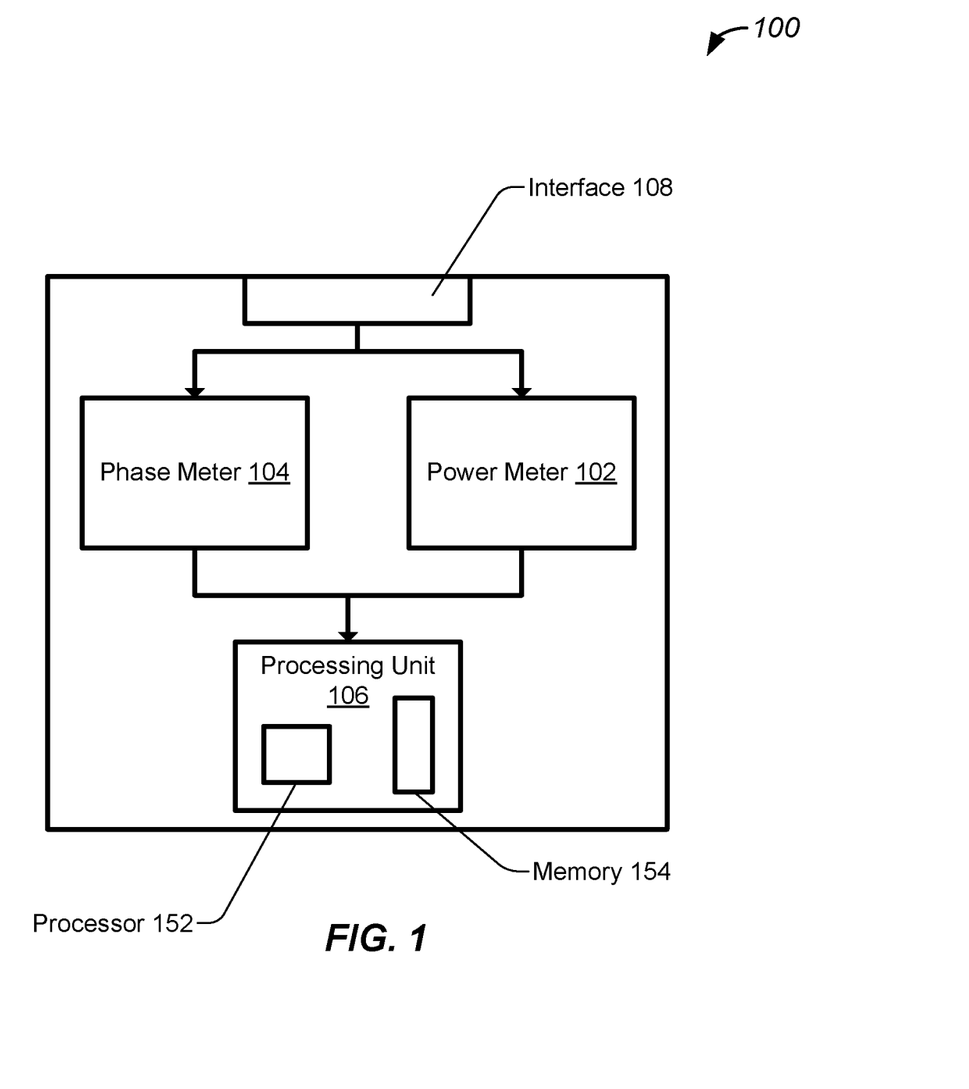
FIG. 1 illustrates an example of a system for identifying computational operations based on power measurements, configured in accordance with various embodiments.

FIG. 1 illustrates an example of a system for identifying computational operations based on power measurements, configured in accordance with various embodiments. As will be discussed in greater detail below, a device such as system 100, may be configured to measure one or more components or aspects of a power signal generated based on a power supply provided to a signal source. System 100 may be further configured to identify computational events and operations being performed by the signal source associated with the power signal based on the obtained measurements. Accordingly, system 100 may be configured to infer and identify computational operations performed by the signal source, which may be a computer machine or data processing system, even when coupled to the power signal remotely or downstream from the signal source.

In various embodiments, system 100 includes power meter 102 which may be a power measurement unit configured to measure one or more characteristics or aspects of the power signal. For example, power meter 102 may be configured to measure a voltage amplitude and a current amplitude of a voltage signal and current signal included in the power signal. Accordingly, power meter 102 may be configured to periodically sample the power signal via interface 108, and may be further configured to provide such measurements to processing unit 106 and/or store the measurements in a local memory. As will be discussed in greater detail below, the power signal may be a signal generated by a power supply or power grid used to provide power to the signal source, which may be a target computer machine or data processing system.

System 100 may also include phase meter 104 which may be a phase measurement unit configured to measure a phase angle between the voltage and current of the power signal. Accordingly, phase meter 104 may also be configured to periodically sample the power signal and generate measurements that identify a phase angle or difference between the voltage and current of the power signal. As similarly discussed above, such measurements may be provided to processing unit 106 and/or stored in a local memory. As shown in FIG. 1, phase meter 104 may be coupled to the power signal via interface 108. Furthermore, system 100 may be configured such that power meter 102 and phase meter 104 are able to generate their respective measurements independent of each other, and provide such measurements to processing unit. In various embodiments, such measurements may be generated and stored as time series data, and/or as averaged data.

System 100 may further include processing unit 106 which may be configured to identify computational operations based on the measurements generated by power meter 102 and phase meter 104. Accordingly, as will be discussed in greater detail below with reference to FIGS. 4-7, processing unit 106 may be configured to identify discrete computational events and patterns of such events based on the measurements received from power meter 102 and phase meter 104. Processing unit 106 may be further configured to associate the identified computational events and patterns to known computational operations. In this way, measurements and identified patterns in voltage amplitudes, current amplitudes, and phase angles of a power signal may be used to identify specific computational operations being performed by a signal source associated with that power signal. Additional details regarding the identification of computational events and/or operations are provided below in FIGS. 4-7. As similarly discussed above, processing unit 106 also includes one or more components configured to identify events as discussed above, such as processor 152 and associated memory 154. Additional details regarding the components of processing unit 106 and its associated communications interfaces are discussed in greater detail below with reference to FIG. 8.

System 100 also includes interface 108 which may be configured to couple components of system 100 with the power signal. As will be discussed in greater detail below with reference to FIGS. 2A, 2B, 3A, and 3B, interface 108 may be coupled with a power source and signal source in a variety of ways, such as in parallel and in series. In some embodiments, interface 108 may be a power plug that includes a plug configured to be inserted in a power socket which may be a wall socket. In various embodiments, interface 108 may accomplish such coupling via a coupler that may be configured to provide a point of access to the power signal. Additional details regarding such couplers are provided below in FIGS. 2A, 2B, 3A, and 3B.

In this way, phase meter 104 and power meter 102 may be used to collect voltage, current, power, and phase angle measurements, and any combination of these measurements may be utilized by processing unit 106 to identify computational operations. For example, one of the measurements may be used, some of the measurements may be used, or all of the measurements may be used. Furthermore, while FIG. 1 illustrates phase meter 104 and power meter 102 being included in system 100, either phase meter 104 and power meter 102 may be implemented optionally. Accordingly, system 100 may be implemented with either phase meter 104 or power meter 102. The same may be true for FIGS. 2A, 2B, 3A, 3C, and FIGS. 4-7 discussed in greater detail below.

Figure 2A:
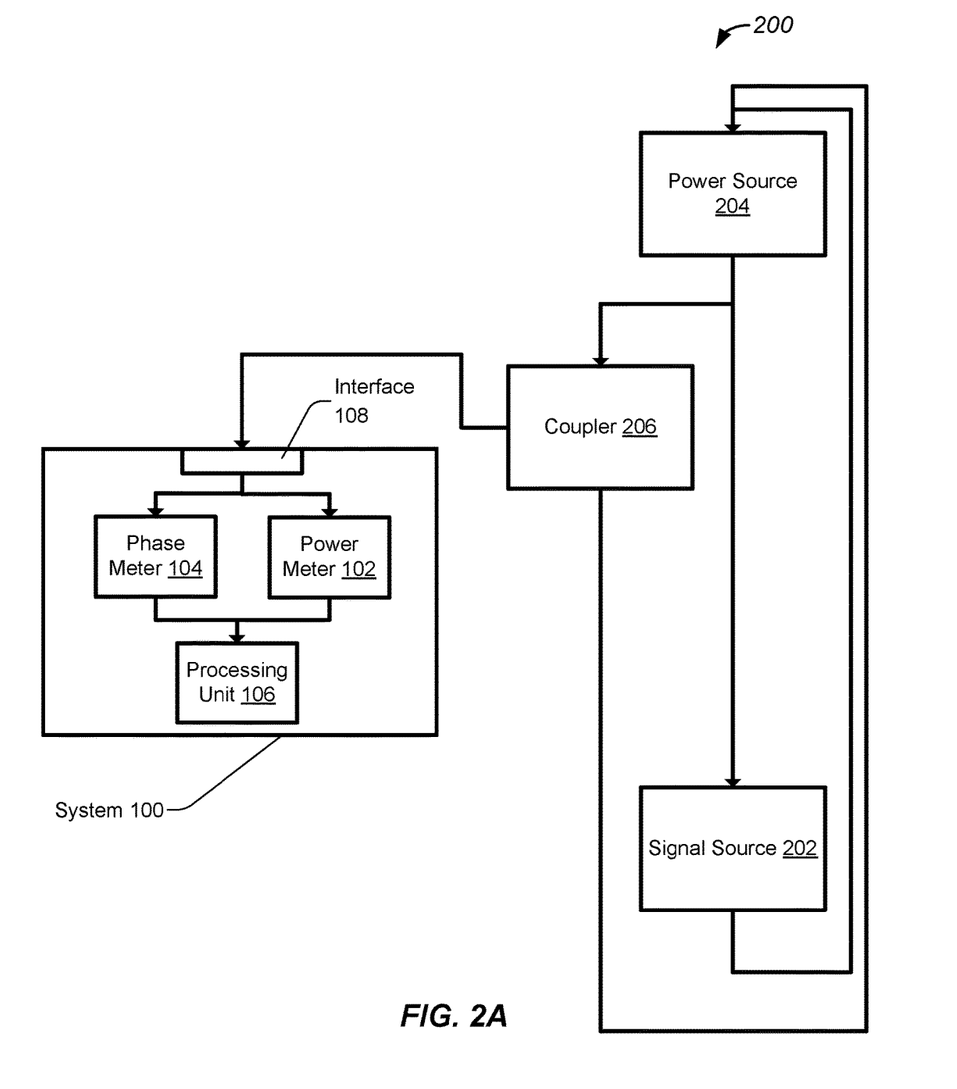
FIG. 2A illustrates another example of a system for identifying computational operations based on power measurements, configured in accordance with various embodiments.

FIG. 2A illustrates an example of a system for identifying computational operations based on power measurements, configured in accordance with various embodiments. As discussed above, a device, such as system 100, may be coupled in parallel with a target computer machine or data processing system, and may obtain measurements used to identify computational operations being performed by the target computer machine or data processing system. Accordingly, system 200 may include system 100. As discussed above, system 100 may include power meter 102, phase meter 104, and processing unit 106. Furthermore, as shown in FIG. 2A, system 100 may be coupled to a power signal associated with power source 204 and signal source 202 via coupler 206. As disclosed herein, power source 204 may be any source of power, such as a power plant or generator, used to provide power to signal source 202.

As similarly discussed above, signal source 202 may be a computer machine or a data processing system. Accordingly, signal source 202 may include various hardware components, such as computer processor units (CPUs), graphical processor units (GPUs), network cards, hard disk drives, memory devices, and cooling devices that may be used to implement complex and computationally intensive data processing operations. As will be discussed in greater detail below, when such operations are implemented by signal source 202, components of signal source 202 may be heavily utilized in a particular fashion, thus causing corresponding fluctuations in components of a power signal generated by power source 204. For example, if a video transcoding operation is implemented, input/output (I/O) devices such as hard disks may be heavily utilized and cause a particular fluctuation or modification to the power signal supplied to the hard disks. Such fluctuations may be measured by system 100 and form the basis of the identification of computational operations performed by processing unit 106, as will be discussed in greater detail below.

As disclosed herein, system 200 may be configured such that system 100 may be coupled to the power signal at one of many locations relative to signal source 202. In some embodiments, system 100 may be coupled to the power signal at a remote location. For example, coupler 206 may be a plug configured to be inserted in a wall power socket, and interface 108 may be a chord or cable that is attached to the plug. In this example, system 100 may be coupled to the power signal at a separate geographical location than signal source 202, such as a separate building or city, and at a separate location on a power grid used power source 204 to provide the power signal to signal source 202. In various embodiments, system 100 may be coupled to the power signal at a local location. For example, coupler 206 may be a power plug located in the same geographical location and point on the power grid. Moreover, coupler 206 may be a signal tap that may be included within signal source 202 and integrated with the components of signal source 202. Accordingly, coupler 206 may be coupled at a location that is upstream or downstream of signal source 202, as well as on the same electrical pathway or a different electrical pathway (as shown in FIG. 2A) as signal source 202.

As shown in FIG. 2A, system 100 may be coupled in parallel with signal source 202. Accordingly, both system 100 and signal source 202 may be coupled to power source 204 in parallel such that they both receive a power signal generated by power source 204. When coupled in this way, sufficient electrical coupling may exist between signal source 202 and system 100 such that variations in operations performed by components of signal source 202 cause measurable changes in the power signal generated by power source 204, such as changes in an alternating current (AC) voltage level, which may be applied to a power grid. FIG. 2A is a simplified representation of a system, such as system 200, which may include one or more intervening components, similar to those described in greater detail below with reference to FIGS. 3A and 3B.

Figure 2B:
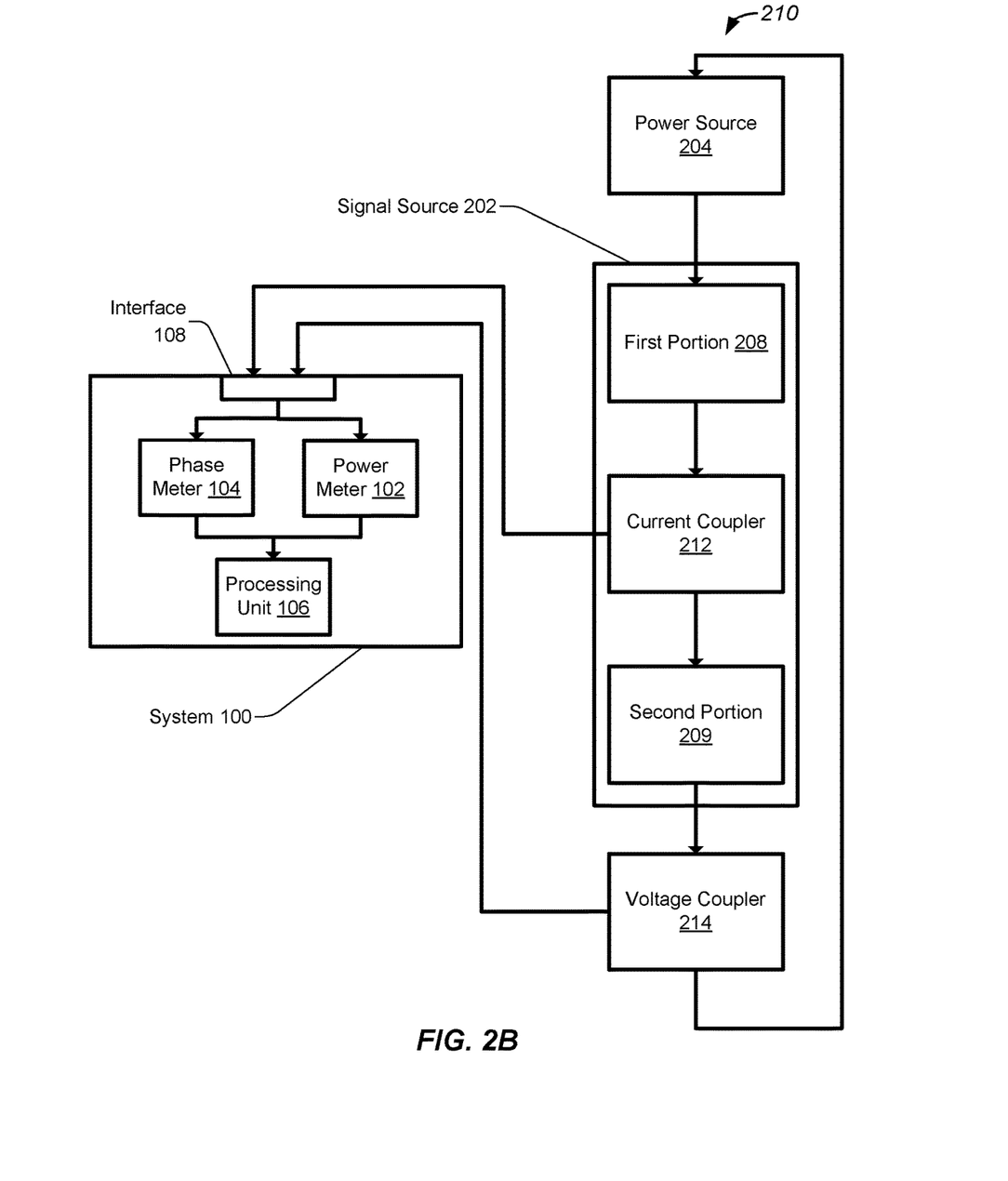
FIG. 2B illustrates yet another example of a system for identifying computational operations based on power measurements, configured in accordance with various embodiments.

FIG. 2B illustrates another example of a system for identifying computational operations based on power measurements, configured in accordance with various embodiments. As discussed above, a device, such as system 100, may be coupled in series with a target computer machine or data processing system, and may obtain measurements used to identify computational events and/or operations being performed by the target computer machine or data processing system. Accordingly, system 210 may include system 100. As discussed above, system 100 may include power meter 102, phase meter 104, and processing unit 106. Furthermore, as shown in FIG. 2B, system 100 may be coupled to a power signal associated with power source 204 and signal source 202 via several couplers. Accordingly, coupler 206 discussed above may be implemented as two or more separate couplers which may be independently configurable such that their attachment points to electrical pathways may be determined independently. For example, coupler 206 may be implemented as current coupler 212 and voltage coupler 214 which may be configured to obtain current and voltage measurements respectively.

As similarly discussed above, system 210 may be configured such that system 100 may be coupled to the power signal at one of many locations relative to signal source 202. In some embodiments, system 100 may be coupled to the power signal at a remote location that may be a different geographical location, and may also be a different part of a power grid. Furthermore, according to various embodiments, system 100 may be coupled to the power signal at a local location. For example, current coupler 212 may be a connector box located in the same geographical location and point on the power grid. More specifically, current coupler 212 may be a connector box that is coupled to or tapped into the components and power infrastructure of signal source 202.

As shown in FIG. 2B, current coupler 212 may be placed in series between two portions or components of signal source 202, such as first portion 208 and second portion 209. In one example, first portion 208 may be a rack of hardware components that includes various CPUs configured to perform various processing operations. Moreover, second portion 209 may be a rack of I/O devices, such as hard disks, configured to perform various read and write operations. Accordingly, system 100 may be coupled, via current coupler 212, in series between the two racks of components. In various embodiments, system 100 may be further coupled via voltage coupler 214 which may be configured to obtain voltage measurements. As shown in FIG. 2B, voltage coupler 214 may be coupled in series with signal source 202 and on the same electrical pathway. As discussed in greater detail below, the location of voltage coupler 214 may be varied, and in various embodiments, voltage coupler may be implemented on a separate electrical pathway and in parallel with signal source 202. When coupled in this way, variations in operations performed by components of signal source 202 cause measurable changes in the power signal generated by power source 204 and passed through signal source 202 and its respective portions and components. Such changes may include changes in an alternating current (AC) voltage level, current level, and phase angle of the power signal.

While FIG. 2B illustrates current coupler 212 coupled in series between portions of signal source 202, additional embodiments are disclosed herein where current coupler 212 is implemented in series with signal source 202, but outside of and not included in signal source 202. For example, first portion 208 may include all of the components of signal source 202 and may be represented as signal source 202. In this example, second portion 209 is not implemented, and current coupler 212 is coupled in series between signal source 202 and power source 204. When coupled in this way, current coupler 212 may be placed before and upstream or after signal source 202 and may still obtain the measurements described above and in greater detail below. Furthermore, as similarly discussed above, voltage coupler 214 may be coupled at a location that is upstream or downstream of signal source 202, as well as on the same electrical pathway or a different electrical pathway as signal source 202. Further still, as similarly discussed above, FIG. 2B is a simplified representation of a system, such as system 210, which may include one or more intervening components, similar to those described in greater detail below with reference to FIGS. 3A and 3B.

Figure 3A:
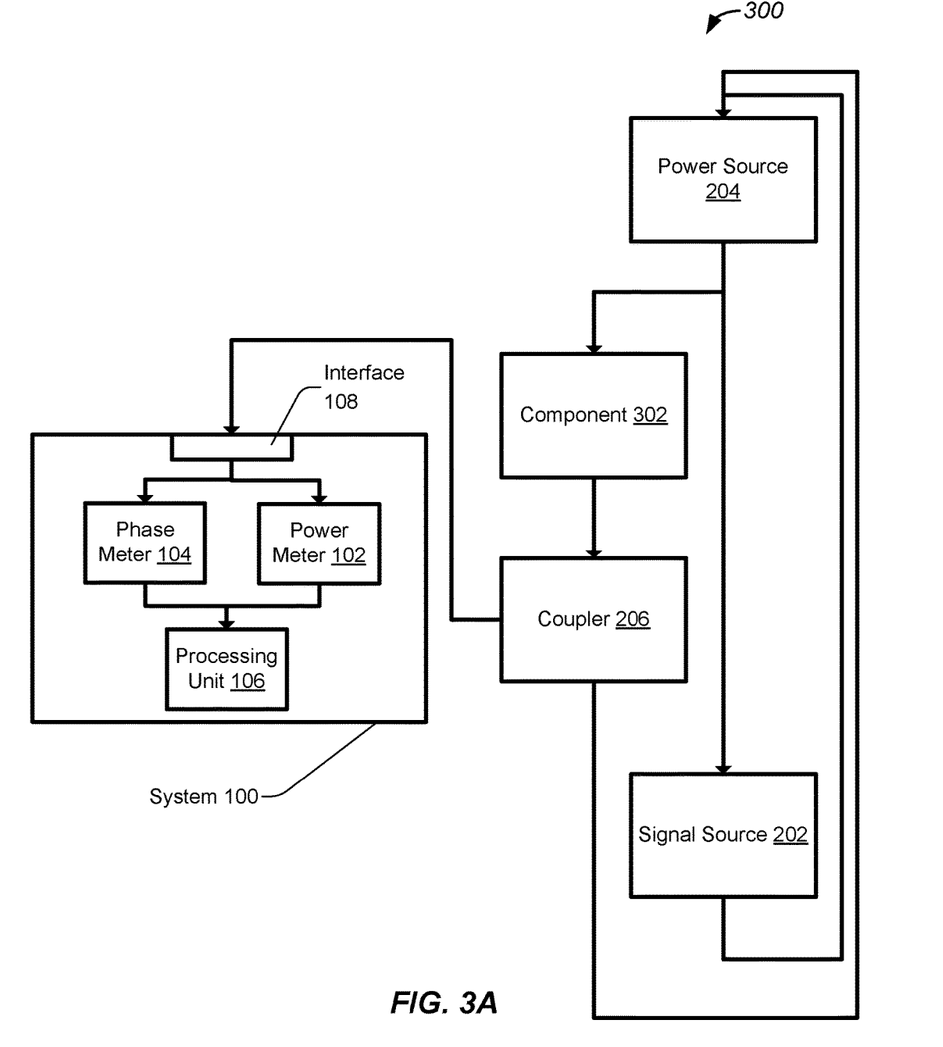
FIG. 3A illustrates an additional example of a system for identifying computational operations based on power measurements, configured in accordance with various embodiments.

FIG. 3A illustrates yet another example of a system for identifying computational operations based on power measurements, configured in accordance with various embodiments. As similarly discussed above, a system, such as system 300, may include system 100 that may be coupled to power source 204 in parallel with signal source 202. As similarly discussed above, system 100 may include power meter 102, phase meter 104, and processing unit 106. Moreover, system 100 may be coupled in parallel via interface 108 and coupler 206. As shown in FIG. 3A, system 300 may also include component 302 which may be a component of a power grid or power distribution infrastructure. Accordingly, component 302 may be power transformer or power relay that is coupled between system 100 and signal source 202. When coupled in this way, system 100 is configured such that system 100 may continue to obtain measurements of the power signal and identify computational operations of signal source 202 despite the presence of intervening components such as component 302. As similarly discussed above, coupler 206 may be coupled at a location that is upstream or downstream of signal source 202, as well as on the same electrical pathway or a different electrical pathway (as shown in FIG. 3A) as signal source 202.

Moreover, while FIG. 3A illustrates one example of components, such as component 302, in various embodiments, there may be several additional components, such as a second component, third component, and fourth component also located before coupler 206. In this way, system 100 may be configured to obtain measurements and identify computational operations despite the presence of numerous intervening components. Moreover, while FIG. 3A shows component 302 being coupled before coupler 206 relative to power source 204, such components may be coupled before or after coupler 206.

Figure 3B:
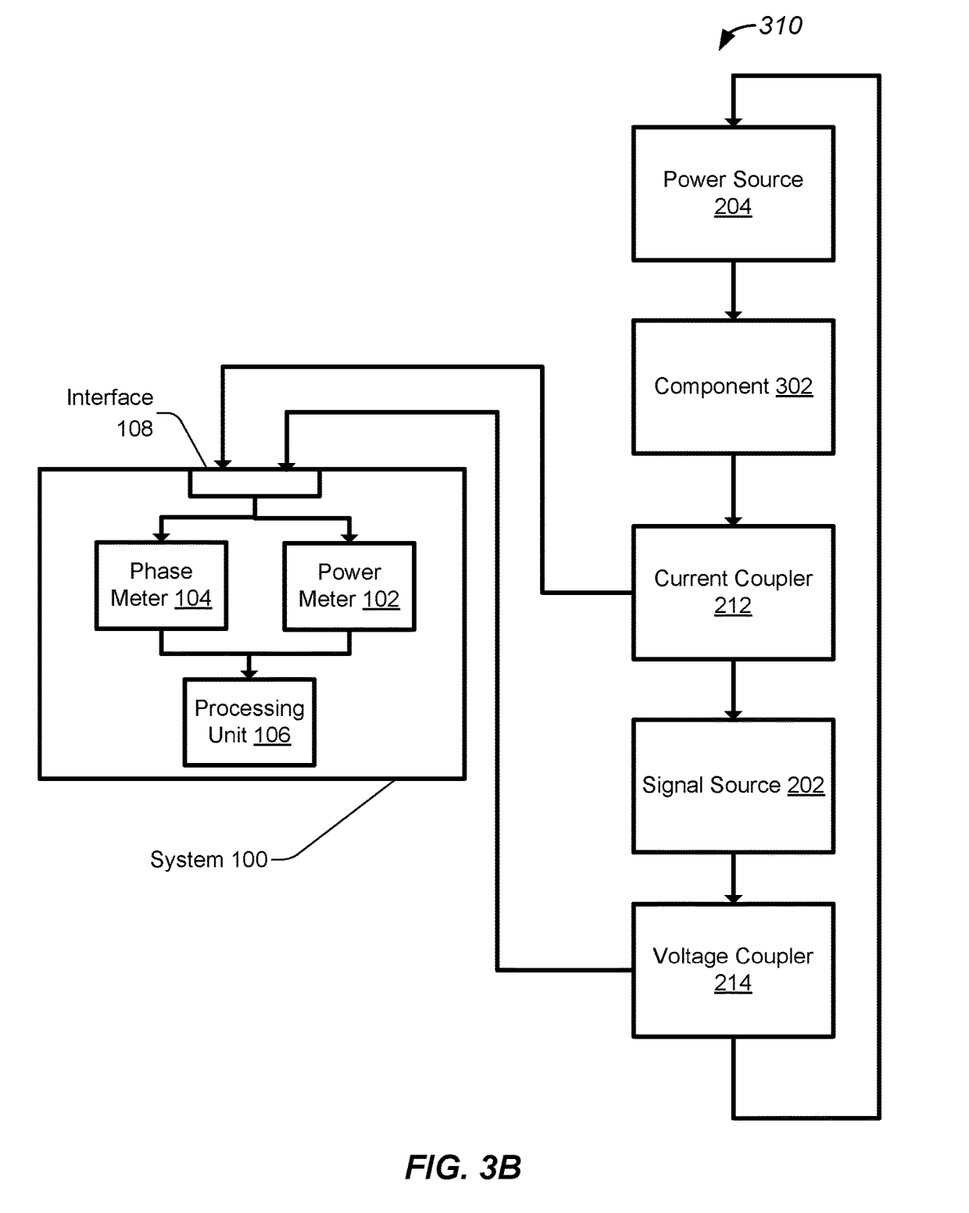
FIG. 3B illustrates another example of a system for identifying computational operations based on power measurements, configured in accordance with various embodiments.

FIG. 3B illustrates an additional example of a system for identifying computational operations based on power measurements, configured in accordance with various embodiments. In various embodiments, a system, such as system 310, may also include system 100 that may be coupled to power source 204 in series with signal source 202. As similarly discussed above, system 100 may include power meter 102, phase meter 104, and processing unit 106. Moreover, system 100 may be coupled in series via interface 108 and couplers 212 and 214. As similar discussed above, system 310 may also include component 302 which may be a component of a power grid or power distribution infrastructure. As described above, when coupled in this way, system 100 is configured such that system 100 may continue to obtain measurements of the power signal and identify computational operations of signal source 202 despite the presence of intervening components such as component 302 that may be coupled in series between signal source 202 and system 100.

Moreover, voltage coupler 214 may be coupled at a location that is upstream or downstream of signal source 202, as well as on the same electrical pathway or a different electrical pathway as signal source 202. Furthermore, while FIG. 3B illustrates one example of components, such as component 302, in various embodiments, there may be several additional components, such as a second component, third component, and fourth component located before and/or after current coupler 212. In this way, system 100 may be configured to obtain measurements and identify computational operations despite the presence of numerous intervening components of a power distribution grid. Accordingly, while FIG. 3B shows component 302 being coupled before current coupler 212 relative to power source 204, such components may be coupled before or after current coupler 212 and/or voltage coupler 214.

Figure 4:
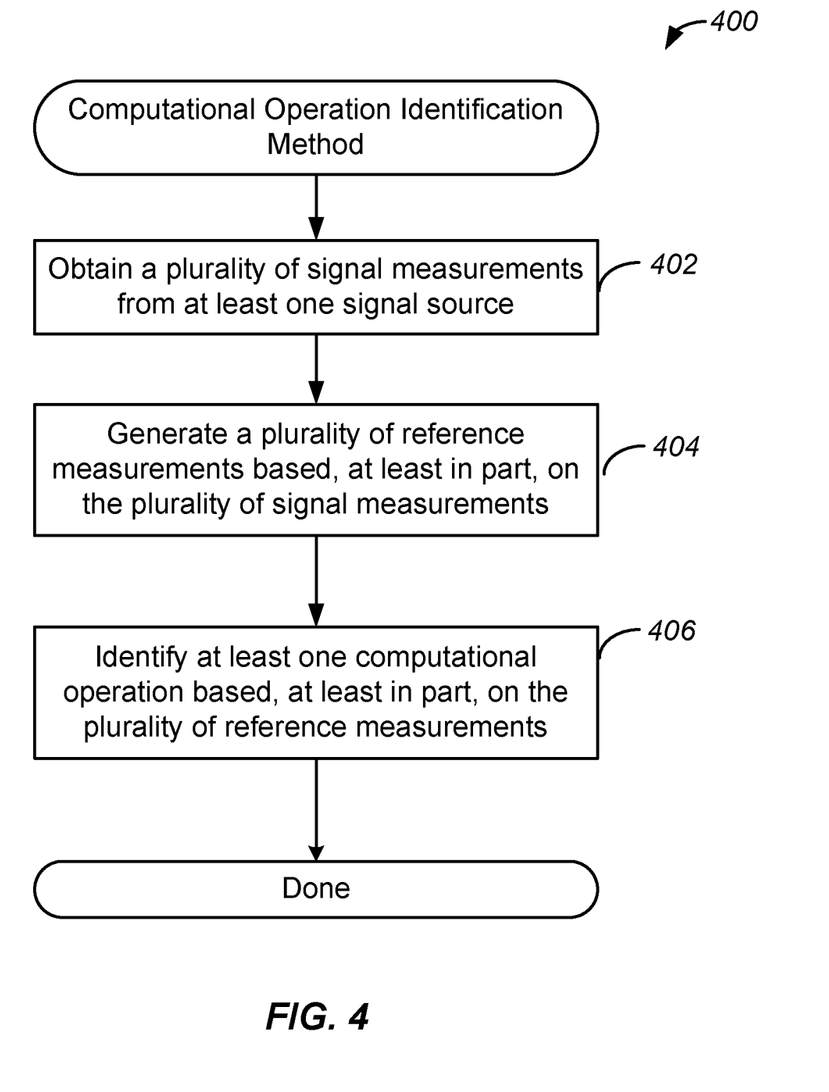
FIG. 4 illustrates a flow chart of an example of a method for identifying computational operations based on power measurements, implemented in accordance with various embodiments.

FIG. 4 illustrates a flow chart of an example of a method for identifying computational operations based on power measurements, implemented in accordance with various embodiments. As will be discussed in greater detail below, a system or device, such as system 100 may be configured or trained to identify particular types of computational events and operations, which may be represented by patterns of events. Accordingly, various embodiments disclosed herein may form reference measurements that provide a ground truth that may be used for subsequent determinations and identifications of computational operations.

Accordingly, method 400 may proceed with operation 402 during which a plurality of signal measurements may be obtained from at least one signal source. As similarly discussed above, such measurements may be voltage amplitude, current amplitude, and/or phase angle measurements of a power signal associated with the at least one signal source. Such measurements may be made by components of a device, such as system 100, that may include a power meter and a phase meter.

Method 400 may proceed to operation 404 during which a plurality of reference measurements may be generated based, at least in part, on the plurality of signal measurements. As will be discussed in greater detail below with reference to FIG. 5, reference measurements may be made by implementing known computational events and/or operations, and measuring the resulting changes and fluctuations in a power signal provided to a computer machine or data processing system used to implement the computational events and/or operations. As discussed below, such reference measurements may be generated using a test machine or system, and such reference measurements may include data values that characterize or represent particular computational events, patterns of events, and computational operations associated with such patterns of events.

Method 400 may proceed to operation 406 during which at least one computational operation may be identified based, at least in part, on the plurality of reference measurements. Accordingly, additional measurements may be taken from a target computer machine or data processing system. Such additional measurements may be compared with the reference measurements. The result of the comparison may be used to identify particular computational events and/or operations being performed by the target computer machine or data processing system. Additional details regarding such a comparison and identification of computational operations are provided below with reference to FIGS. 5, 6, and 7.

Figure 5:
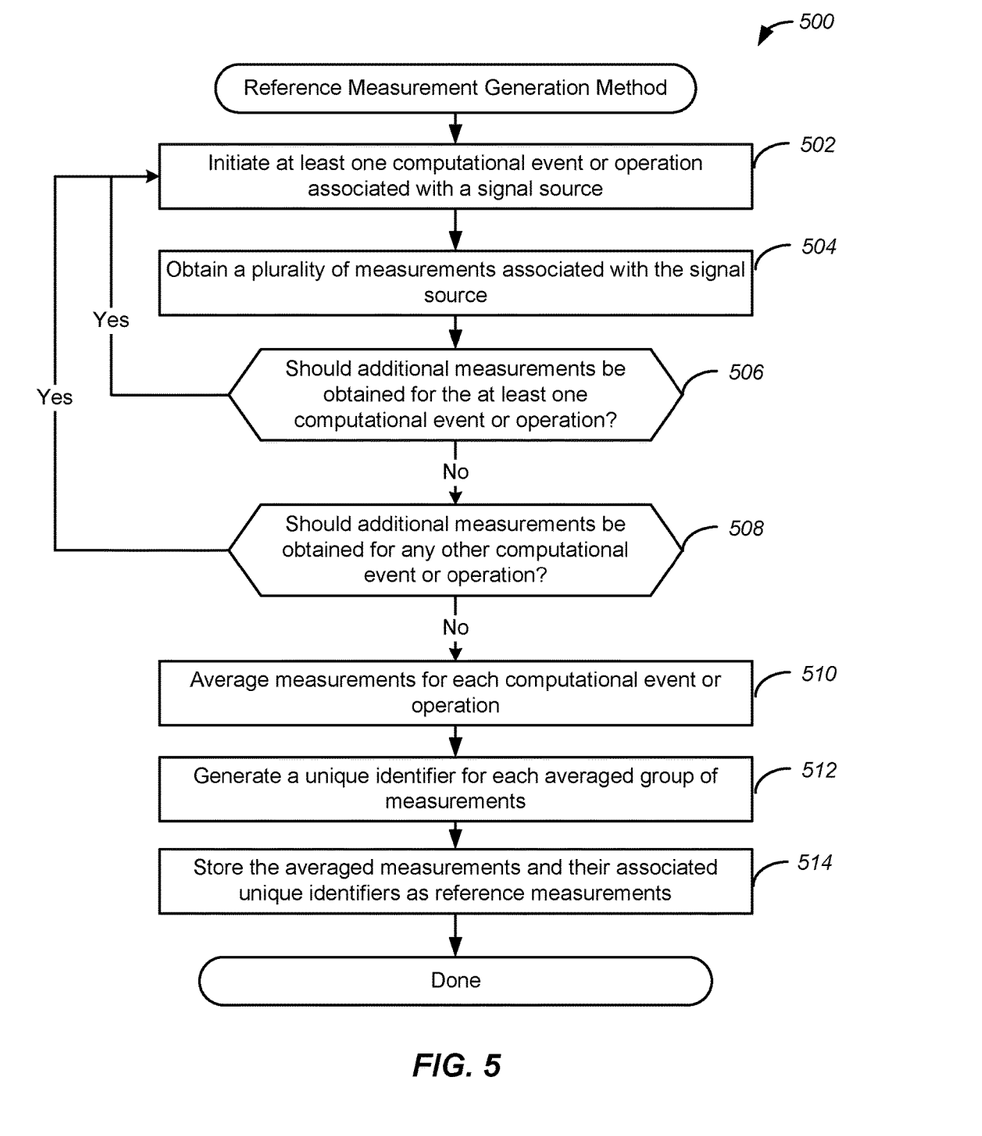
FIG. 5 illustrates a flow chart of an example of a method for generating reference measurements, implemented in accordance with various embodiments.

FIG. 5 illustrates a flow chart of an example of a method for generating reference measurements, implemented in accordance with various embodiments. As discussed above, such reference measurements may be utilized to identify computational events or operations performed by a target machine or system. Accordingly, the reference measurements provide a ground truth against which measurements from a target machine or system may be compared. As will be discussed in greater detail below, such reference measurements may be generated based on numerous iterations and measurements of computational events and computational operations.

Accordingly, method 500 may commence with operation 502 during which at least one computational event or operation may be initiated. The computational event or operation may be associated with a signal source, such as a computer machine or data processing system that is coupled with a power source. In some embodiments, the signal source may be configured as a test device or system that may implement a designated set of computational events and operations in a designated order a designated number of times. In various embodiments, such configuration of the test device or system may be implemented via configuration parameters that may be specified by an automated script or protocol that identifies a set of computational events and/or operations to be performed, an order in which they are performed, and a number of times each one is performed. Accordingly, such configuration parameters may identify stress tests for particular hardware components that are configured to stress their processing capabilities. The configuration parameters may also identify computational operations to be performed, such as dense linear algebra computations, sparse linear algebra computations, spectral methods, N-body methods, structured grids, unstructured grids, MapReduce operations, combinational logic, graph traversals, dynamic programming, backtrack and Branch-and-Bound operations, graphical modeling, finite state machine operations, and matrix multiplication. As previously discussed, such computational operations may also include atmospheric simulation, monitoring of climate data, super nova simulation, tree search and graph problems, password cracking, video transcoding, and prime factoring of numbers. While some examples are described here, additional examples are provided below.

Accordingly, during operation 502, an initial computational event or operation may be started in accordance with the configuration parameters, and one or more components of the test device or system may implement the computational event or operation. As will be discussed in greater detail below, such a computational event or operation may be resource intensive and may involve additional power consumption by hardware resources such as CPUs, GPUs, hard disks, and network cards. Moreover, the computational event or operation implemented during operation 502 may be designated by the configuration parameters. Accordingly, the configuration parameters may include a list of computational event and/or operations that may be performed in order, and a designated number of times each, as will be discussed in greater detail below.

Method 500 may proceed to operation 504 during which a plurality of signal measurements associated with the signal source may be obtained. Accordingly, a power meter and phase meter may be used to measure a power signal supplied to the signal source throughout the duration of the computational event or operation being performed. As discussed above, such power measurements may include voltage amplitude, current amplitude, and phase angle of the power signal. Such measurements may be made and stored by a component of system 100, such as processor unit 106.

Method 500 may proceed to operation 506 during which it may be determined if additional measurements should be obtained for the at least one computational event or operation. Such a determination may be made based on the configuration parameters that were originally specified. For example, the configuration parameters may indicate that 10 additional iterations of the measurement should be made before proceeding on the next computational operation for which reference data should be generated. If it is determined that additional measurements should be made, then method 500 may return to operation 502 during which the same computational event or operation may be implemented, and additional measurements may subsequently be taken. If it is determined that no additional measurements should be made for the at least one computational event or operation, method 500 may proceed to operation 508.

Accordingly, during operation 508 it may be determined if measurements should be made for any other computational event or operation. As similarly discussed above, such a determination may be made based on the configuration parameters which may identify a plurality of computational event and/or operations for which reference data is to be generated, and stepping through an ordered representation, such as a list, of those computational operations. If it is determined that measurements should be made for an additional computational event or operation, method 500 may return to operation 502 during which the next computational event or operation may be implemented. If it is determined that no additional measurements should be made for any other computational event or operation, method 500 may proceed to operation 510.

Method 500 may proceed to operation 510 during which measurements may be averaged for each computational event or operation. In various embodiments, averaging measurements made for each computational event or operation may reduce the effects of noise upon the reference data that is ultimately generated. For example, in a particular iteration of a measurement for a particular computational operation, other extraneous devices implemented elsewhere that may be coupled to the same power grid or power supply as the test device or system, and the extraneous devices may intermittently perform operations that may generate signal noise that affects the measurements of the test device or system. By averaging numerous iterations of such measurements, the effect of such extraneous devices may be attenuated.

Method 500 may proceed to operation 512 during which a unique identifier may be assigned to each averaged group of measurements. The unique identifier may be generated based on the computational event or operation originally identified by the configuration parameters. Thus, each averaged group of measurements may be tagged with an identifier that characterizes or represents the computational event or operation that underlies its generation. In various embodiments, such a unique identifier may be a randomly generation sequence of numbers or characters.

Method 500 may proceed to operation 514 during which the averaged measurements as well as their associated identifiers may be stored as reference measurements. Accordingly, a component of system 100, such as processing unit 106, may store the averaged measurement data, which may be representative of averaged time series, as well as the associated identifiers as reference data. In this way, the reference data may include a representation of characteristic measurement data for each designated computational event or operation. As will be discussed in greater detail below with reference to FIG. 6, such reference data may form the basis of identifying computational events and operations performed by target devices and systems.

Figure 6:
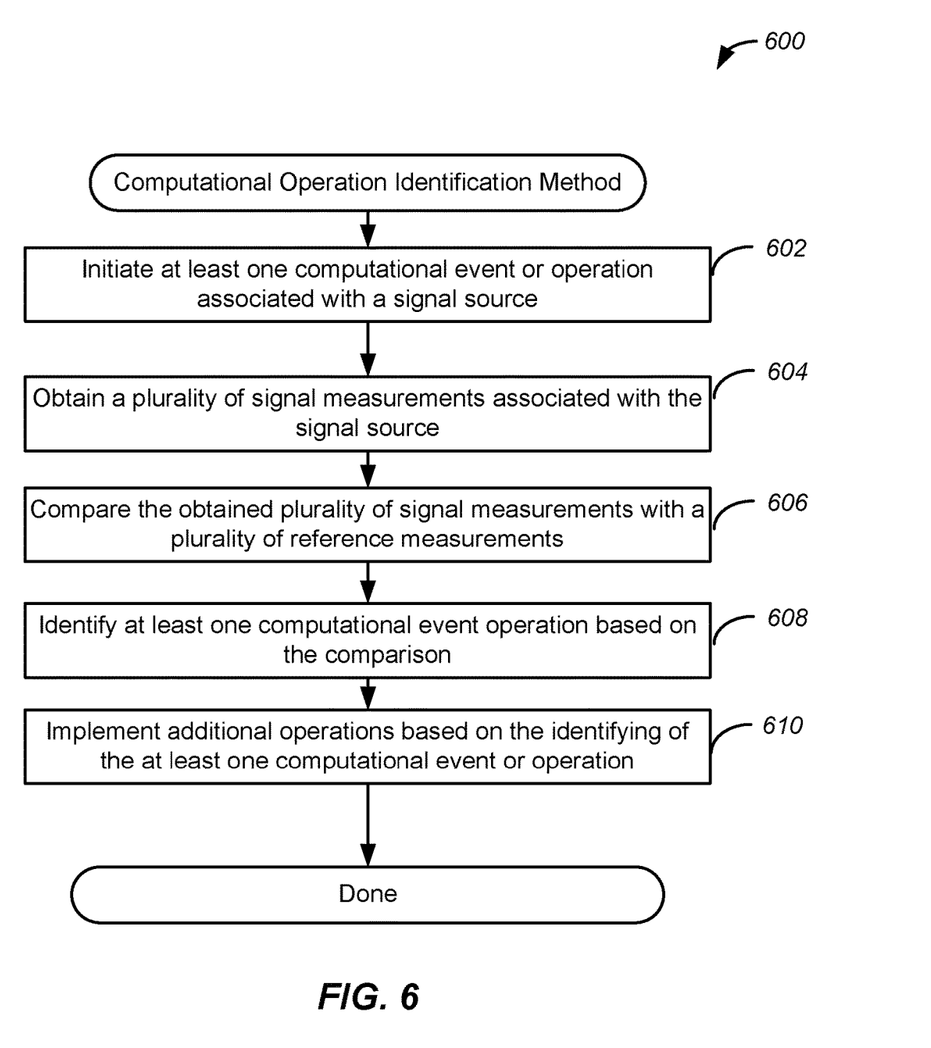
FIG. 6 illustrates a flow chart of another example of a method for identifying computational operations based on power measurements, implemented in accordance with various embodiments.

FIG. 6 illustrates a flow chart of another example of a method for identifying computational operations based on power measurements, implemented in accordance with various embodiments. As previously discussed, reference measurements may be used as the basis of identifying particular computational events and operations. As will be discussed in greater detail below, measurements may be made for a target device or system for which computational activity is to be determined and inferred, and such measurements may be compared against the reference measurements to identify and characterize such computational activity.

Method 600 may commence with operation 602 during which at least one computational event or operation associated with a signal source may be implemented. As stated above, the signal source may be a target device or system for which computational activity is to be determined or inferred. Such a target device or system may include various hardware such as racks of CPUs and I/O devices configured to implement computationally intensive operations. Accordingly, the target device or system may implement one or more computational events and/or operations during operation 602. For example, the target device or system may implement a computational operation that is CPU intensive, such as password cracking.

Method 600 may proceed to operation 604 during which a plurality of signal measurements may be obtained. Accordingly, a power meter and phase meter may be used to measure aspects of a power signal supplied to the signal source throughout the duration of the computational operation being performed. As discussed above, such power measurements may include voltage amplitude, current amplitude, and phase angle of the power signal. Such measurements may be made and stored by a component of system 100, such as processor unit 106. Moreover, such measurements may be made using any of the configurations described above with reference to FIGS. 1, 2A, 2B, 3A, and 3B.

Method 600 may proceed to operation 606 during which the obtained plurality of signal measurements may be compared with a plurality of reference measurements. Accordingly, the obtained signal measurements may be compared against stored set of reference measurements to determine if a match exists. In various embodiments, the reference measurements may be determined based on previously generated reference data which may have been generated based on previously obtained measurements. In one example, such previously obtained measurements may have been made under reference or test conditions. In some embodiments, the comparison may involve the use of statistical analysis and/or modeling techniques, and/or machine learning analysis. For example, the reference data may be used as training data provided to and used to train one or more machine learning algorithms. A statistical and/or machine learning analysis may be implemented to identify particular features of the reference data, such as the strength of individual signals (such as current, voltage, and phase), time-series patterns of those signals, individually or combined, taking relative strength of the signals into account, and the number of times the patterns occur. In some embodiments, once trained to identify such features, a machine learning analysis may be performed on the signal measurements to determine if the signal measurements match a particular event or operation associated with a particular set of reference measurements.

Method 600 may proceed to operation 608 during which at least one computational operation may be identified based on the comparison. As discussed above, a statistical analysis and/or machine learning analysis may be implemented to identify if a match exists, and further identify with which reference measurements a match has been identified. Accordingly, the unique identifier associated with the matching reference measurements may be retrieved if a match is found, and the unique identifier may be used to identify a particular type of computational event or operation.

Method 600 may proceed to operation 610 during which additional operations may be implemented based on the identifying of the at least one computational event or operation. Thus, according to various operations, system 100, and more specifically processing unit 106 of system 100, may be configured to implement additional operations responsive to the identifying of the computational event or operation. For example, system 100 may automatically generate a report or notification that identifies the at least one computational event or operation. The notification may be an electronic message such as an email notification. The notification may be stored in memory as a report. Moreover, as will be discussed in greater detail below with reference to FIG. 7, various specific operations may be implemented responsive to the identifying of the computational event or operation to affect the operation of the target device or system.

Figure 7:
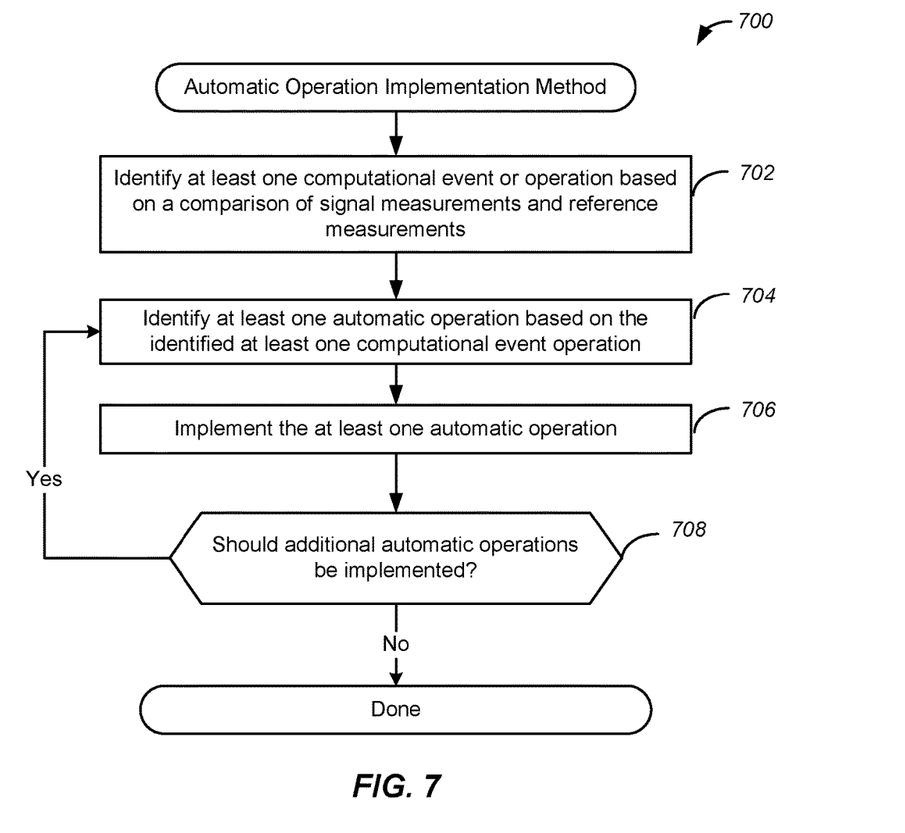
FIG. 7 illustrates a flow chart of an example of a method for implementing one or more automatic operations based on identified computational operations, implemented in accordance with various embodiments.

FIG. 7 illustrates a flow chart of an example of a method for implementing one or more automatic operations based on identified computational operations, implemented in accordance with various embodiments. In various embodiments, such automatic operations may be implemented to take one or more actions that are responsive to the identified computational events or operations, and that may be specifically selected to affect the identified computational operations. As will be discussed in greater detail below, the implementation of such automatic operations as disclosed herein enables the implementation of dynamic and real time features such as power management and security enforcement that are not otherwise possible.

Method 700 may commence with operation 702 during which at least one computational event or operation may be identified based on a comparison of signal measurements and reference measurements. As discussed above with reference to FIG. 6, reference measurements may be compared with signal measurements, and such a comparison may be used to identify a particular type of computational event or operation that has been implemented by a target device or system.

Method 700 may proceed to operation 704 during which at least one automatic operation may be identified based on the identified at least one computational event or operation. In various embodiments, the at least one automatic operation may be identified based on a designated mapping of computational events and operations to automatic operations. Accordingly, such a mapping may identify a particular type of computational event or operation, and may further identify one or more automatic operations that are to be implemented responsive to identifying the particular type of computational event or operation. In one example, a computational operation of video transcoding may be identified. In this example, the target device or system might not have I/O capabilities or power resources to fully support such a computational operation within administrator-established guidelines. Accordingly, the designated mapping may include an entry that maps that particular computational operation to an automatic operation that generates a message or signal that shuts down all applications run by the target device or system, thus conserving power utilized by the target device or system.

In another example, a computational operation of password cracking may be identified. In this example, the target device or system might not have authorization to perform such computational operations. Accordingly, the designated mapping may store an entry that maps that computational operation to an automatic operation that generates a signal or message that locks down the target device or system to prevent further user access. Accordingly, the automatic operation may modify or adjust security access requirements of the target device or system, and/or of a user account associated with the target device or system. For example, security credentials of a user may be revoked. In this way, the designated mapping may be determined based, at least in part, on a type of target device or system, a security access or clearance level of the target device or system, or a power consumption limitation associated with the target device or system.

Method 700 may proceed to operation 706 during which the at least one automatic operation may be implemented. Accordingly, during operation 706, a device such as system 100, may perform one or more actions to implement the automatic operation. For example, system 100 may send a signal via a communications network to the target device or system to implement the security lockout in response to identifying an unauthorized computational event or operation. Similarly, system 100 may send a signal via a communications network to the target device or system to shut down or terminate applications if the target device or system is exceeding an acceptable power consumption or hardware resource utilization rate, as may also occur due to unauthorized access and control of the target device or system that may have been obtained via hacking. As discussed above, such implementation of the automatic operation may be performed dynamically and in real-time. Accordingly, the response time of the previously described security access and power management examples may be fast, thus increasing the efficacy and efficiency of the implementation of such security access and power management policies.

Method 700 may proceed to operation 708 during which it may be determined whether additional automatic operations should be implemented. In some embodiments, an identified computational event or operation may be mapped to many automatic operations which are all to be implemented. Accordingly, if multiple automatic operations are identified and some remain, method 700 may return to operation 704 in which the next automatic operation may be identified and subsequently implemented. If no additional automatic operations are to be implemented, method 700 may terminate.

Figure 8:
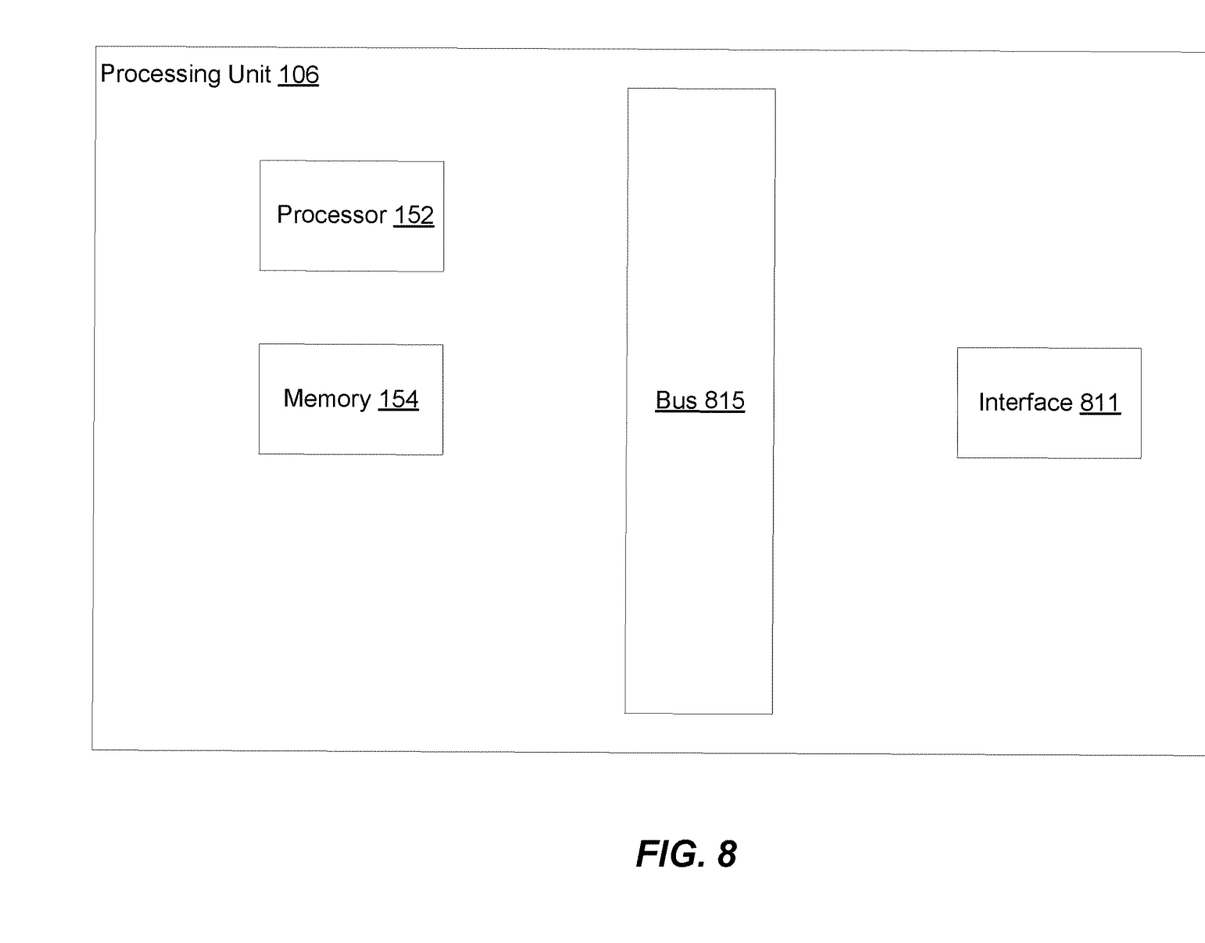
FIG. 8 illustrates a processing unit configured in accordance with some embodiments.

FIG. 8 illustrates a processing unit configured in accordance with some embodiments. As discussed above, processing unit 106 may be used to identify events and operations being performed by a signal source associated with a power signal based on obtained measurements. In various embodiments, processing unit 106 includes processor 152, memory 154, interface 811, and bus 815 (e.g., a PCI bus or other interconnection fabric) and operates as discussed above with reference to FIG. 1. When acting under the control of appropriate software or firmware, processor 152 is responsible for the above described identification of events. Various specially configured devices can also be used in place of processor 152 or in addition to processor 152. For example, processor 152 may further include one or more application specific integrated circuits (ASICs). Such a specific configuration of processor 152 may provide increased efficiency when processing the large amounts of data involved with the previously described systems, devices, and methods. Moreover, in some embodiments, processor 152 may include one or more reprogrammable logic devices, such as field-programmable gate arrays (FPGAs) which may provide increased flexibility when being configured to identify events, as discussed above. In various embodiments, interface 811 is configured to send and receive data packets or data segments over a network.

Particular examples of interfaces supported include Ethernet interfaces, frame relay interfaces, cable interfaces, DSL interfaces, token ring interfaces, USB interfaces, PCI interfaces, SATA interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control communications-intensive tasks such as packet switching, media control and management. In various embodiments, such interfaces may be used for other interfaces of system 100 discussed above, such as interface 108.

As discussed above, processing unit 106 may be included in system 100 which may be configured to measure one or more components or aspects of a power signal generated based on a power supply provided to a signal source, and further configured to identify computational events and operations being performed by the signal source associated with the power signal based on the obtained measurements. Accordingly, the components described in FIG. 8 may be integrated with system 100 discussed above with reference to FIG. 1. Moreover, the components described in FIG. 8 are intended to provide examples of the embodiments disclosed herein, and may also describe components included in other components of system 100, such as other interfaces. Although a particular processing unit is described, it should be recognized that a variety of alternative configurations are possible.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatus. Accordingly, the present examples are to be considered as illustrative and not restrictive.

What is claimed is:

1. A system comprising:
   a phase measurement unit configured to generate a first measurement based on a power signal, the first measurement characterizing a phase angle of the power signal;
   a power measurement unit configured to generate a second measurement based on the power signal, the second measurement characterizing an amplitude of one or more aspects of the power signal; and
   a processing unit configured to identify a computational operation implemented by a target processing device, the identifying of the computational operation being based on a comparison of the first measurement and the second measurement with reference measurements.

2. The system of claim 1, wherein the phase measurement unit is configured to generate the first measurement based on a difference between phases of a voltage signal and a current signal included in the power signal.

3. The system of claim 2, wherein the power measurement unit is configured to generate the second measurement based on a first amplitude of the voltage signal and a second amplitude of the current signal.

4. The system of claim 1, wherein the processing unit is configured to identify one or more computational events associated with the target processing device based, at least in part, on the first measurement and the second measurement.

5. The system of claim 4, wherein the processing unit is further configured to identify one or more computational operations based, at least in part, on the identified one or more computational events.

6. The system of claim 5, wherein the processing unit is configured to identify one or more automatic operations based on the identified computational operation.

7. The system of claim 6, wherein the processing unit is further configured to generate a message in response to identifying, the message causing implementation of the one or more automatic operations.

8. The system of claim 1, wherein the power signal is received from one of a group consisting of: a computer processing unit, a graphical processing unit, a network card, and an input/output device.

9. The system of claim 8, wherein the phase measurement unit and the power measurement unit are coupled in series with a source associated with the power signal.

10. The system of claim 8, wherein the phase measurement unit and the power measurement unit are coupled in parallel with a source associated with the power signal.

11. A system comprising:
a coupler;
a phase measurement unit configured to generate a first measurement based on a power signal, the first measurement characterizing a phase angle of the power signal;
a power measurement unit configured to generate a second measurement based on the power signal, the second measurement characterizing an amplitude of one or more aspects of the power signal;
a processing unit configured to identify a computational operation implemented by a target processing device, the identifying of the computational operation being based on a comparison of the first measurement and the second measurement with reference measurements; and
an interface configured to communicatively couple the coupler with the phase measurement unit and the power measurement unit.

12. The system of claim 11, wherein the phase measurement unit is configured to generate the first measurement based on a difference between phases of a voltage signal and a current signal included in the power signal, and wherein the power measurement unit is configured to generate the second measurement based on a first amplitude of the voltage signal and a second amplitude of the current signal.

13. The system of claim 11, wherein the processing unit is configured to identify one or more computational events associated with the target processing device based, at least in part, on the first measurement and the second measurement, and wherein the processing unit is further configured to identify one or more computational operations based, at least in part, on the identified one or more computational events.

14. The system of claim 11, wherein the processing unit is configured to identify one or more automatic operations based on the identified computational operation.

15. The system of claim 11, wherein the coupler is coupled in series with a source associated with the power signal.

16. The system of claim 11, wherein the coupler is coupled in parallel with a source associated with the power signal.

17. A method comprising:
generating a plurality of signal measurements based on a power signal associated with at least one signal source;
generating a plurality of reference measurements based, at least in part, on the plurality of signal measurements; and
identifying at least one computational operation based, at least in part, on a comparison between the plurality of reference measurements and the plurality of signal measurements, the computational operation being implemented by a target processing device.

18. The method of claim 17, wherein the generating of the plurality of signal measurements further comprises:
generating, using a phase measurement unit, a first measurement based on a difference between phases of a voltage signal and a current signal included in the power signal; and
generating, using a power measurement unit, a second measurement based on a first amplitude of the voltage signal and a second amplitude of the current signal.

19. The method of claim 17 further comprising:
identifying one or more automatic operations based on the identified computational operation; and
generating a message in response to identifying, the message causing implementation of the one or more automatic operations.

20. The method of claim 17, wherein the power signal is received from one of a group consisting of: a computer processing unit, a graphical processing unit, a network card, and an input/output device.

* * * * *